(12) United States Patent
Happ et al.

(10) Patent No.: US 9,064,794 B2
(45) Date of Patent: Jun. 23, 2015

(54) INTEGRATED CIRCUIT INCLUDING VERTICAL DIODE

(71) Applicants: International Business Machines Corporation, Armonk, NY (US); Macronix International Co., Ltd., Hsin Chu (TW); Qimonda AG, Munich (DE)

(72) Inventors: Thomas Happ, Dresden (DE); Hsiang-Lan Lung, Elmsford, NY (US); Bipin Rajendran, White Plains, NY (US); Min Yang, Yorktown Heights, NY (US)

(73) Assignees: International Business Machines Corporation, Armonk, NY (US); Macronix International Co., Ltd, Hsin Chu (TW); Qimonda AG, Munich (DE)

( * ) Notice: Subject to any disclaimer, the term of this patent is extended or adjusted under 35 U.S.C. 154(b) by 78 days.

(21) Appl. No.: 14/073,919

(22) Filed: Nov. 7, 2013

(65) Prior Publication Data

US 2014/0065787 A1    Mar. 6, 2014

Related U.S. Application Data

(62) Division of application No. 12/142,239, filed on Jun. 19, 2008, now Pat. No. 8,586,960.

(51) Int. Cl.
*H01L 21/20* (2006.01)
*H01L 27/24* (2006.01)
*G11C 13/00* (2006.01)

(52) U.S. Cl.
CPC ........ *H01L 27/2481* (2013.01); *G11C 13/0004* (2013.01); *G11C 2213/72* (2013.01); *H01L 27/24* (2013.01)

(58) Field of Classification Search
CPC .................................................. H01L 27/249
USPC .................................. 438/383, 529, 548, 549
See application file for complete search history.

(56) References Cited

U.S. PATENT DOCUMENTS

| | | | |
|---|---|---|---|
| 4,569,121 A * | 2/1986 | Lim et al. ...................... | 438/467 |
| 6,838,692 B1 | 1/2005 | Lung | |
| 6,969,633 B2 | 11/2005 | Dennison | |
| 6,995,446 B2 | 2/2006 | Karpov et al. | |
| 7,449,711 B2 * | 11/2008 | Asano et al. ...................... | 257/4 |
| 2002/0079483 A1 | 6/2002 | Dennison | |
| 2003/0001230 A1 | 1/2003 | Lowrey | |
| 2005/0098811 A1 | 5/2005 | Ogiwara | |
| 2005/0128785 A1 | 6/2005 | Kang | |
| 2005/0194620 A1 | 9/2005 | Dennison et al. | |
| 2006/0034116 A1 | 2/2006 | Lam et al. | |
| 2006/0151771 A1 | 7/2006 | Asano et al. | |

(Continued)

OTHER PUBLICATIONS

Non-Final Office Action mailed Apr. 26, 2013 in U.S. Appl. No. 12/142,239.
Non-Final Office Action mailed Aug. 10, 2011 in U.S. Appl. No. 12/142,239.

(Continued)

*Primary Examiner* — Chandra Chaudhari
(74) *Attorney, Agent, or Firm* — Vazken Alexanian

(57) ABSTRACT

An integrated circuit includes a substrate including isolation regions, a first conductive line formed in the substrate between isolation regions, and a vertical diode formed in the substrate. The integrated circuit includes a contact coupled to the vertical diode and a memory element coupled to the contact. The first conductive line provides a portion of the vertical diode.

20 Claims, 18 Drawing Sheets

(56) References Cited

U.S. PATENT DOCUMENTS

2006/0186483 A1    8/2006    Cho et al.
2006/0284237 A1    12/2006    Park et al.

OTHER PUBLICATIONS

"Full Integration of Highly Manufacturable 512Mb PRAM based on 90nm Technology", J.H. Oh, et al., IEEE, 2006 (4 pgs.).

* cited by examiner

INTEGRATED CIRCUIT INCLUDING VERTICAL DIODE

CROSS-REFERENCE TO RELATED APPLICATIONS

This Utility Patent Application is a divisional application of U.S. application Ser. No. 12/142,239 filed Jun. 19, 2008, which is incorporated herein by reference.

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

Higher density phase change memories can also be achieved by reducing the physical size of each memory cell. Increasing the density of a phase change memory increases the amount of data that can be stored within the memory while at the same time typically reducing the cost of the memory.

For these and other reasons, there is a need for the present invention.

SUMMARY

One embodiment provides an integrated circuit. The integrated circuit includes a substrate including isolation regions, a first conductive line formed in the substrate between isolation regions, and a vertical diode formed in the substrate. The integrated circuit includes a contact coupled to the vertical diode and a memory element coupled to the contact. The first conductive line provides a portion of the vertical diode.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
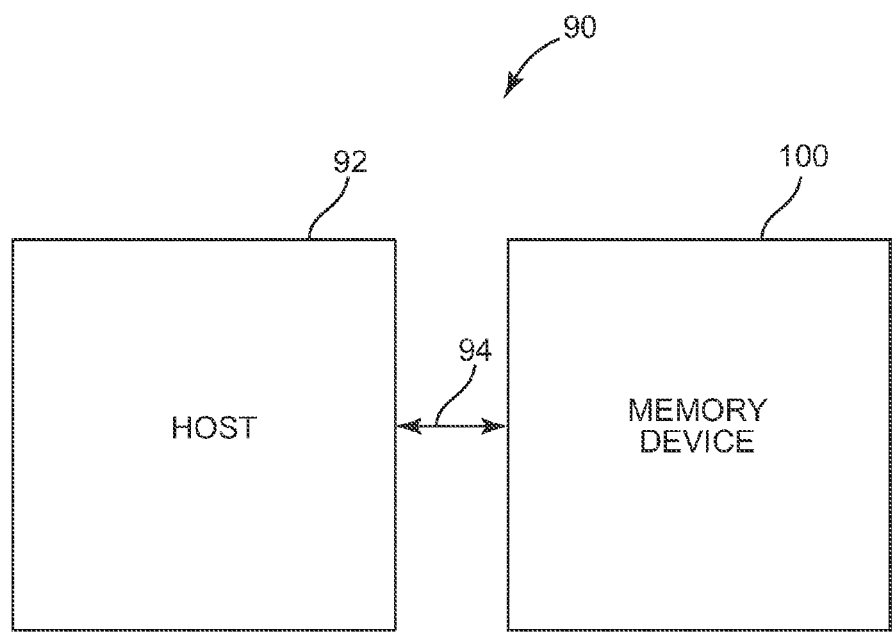
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 provides embedded memory for host 92 and host 92 and memory device 100 are included on a single integrated circuit or circuit board. In one embodiment, memory device 100 includes a phase change memory device or other suitable resistive or resistivity changing material memory device.

Figure 2:
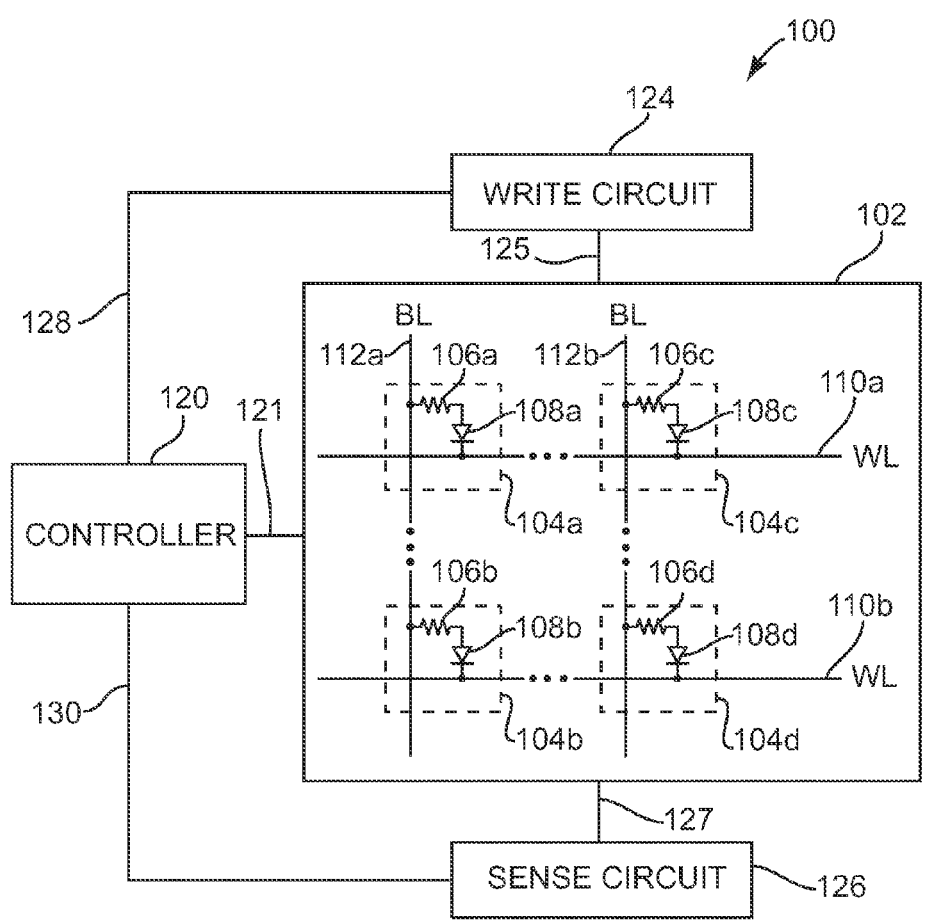
FIG. 2 is a diagram illustrating one embodiment of a memory device.

FIG. 2 is a diagram illustrating one embodiment of memory device 100. Memory device 100 includes a write circuit 124, a controller 120, a memory array 102, and a sense circuit 126. Memory array 102 includes a plurality of resistive memory cells 104a-104d (collectively referred to as resistive memory cells 104), a plurality of bit lines (BLs) 112a-112b (collectively referred to as bit lines 112), and a plurality of word lines (WLs) 110a-110b (collectively referred to as word lines 110). In one embodiment, resistive memory cells 104 are phase change memory cells. In other embodiments, resistive memory cells 104 are another suitable type of resistive memory cells or resistivity changing memory cells.

Each memory cell 104 includes a phase change element 106 and a diode 108. Diodes 108 are formed in a substrate between isolation regions using ion implantation. In one embodiment, the diodes are fabricated simultaneously with peripheral logic in front end of line (FEOL) processes. In one embodiment, the diodes are self-aligned to contact plugs that electrically couple the diodes 108 to the phase change elements 106.

As used herein, the term "electrically coupled" is not meant to mean that the elements must be directly coupled together and intervening elements may be provided between the "electrically coupled" elements.

Memory array 102 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110 and a bit line 112. Phase change memory cell 104a is electrically coupled to bit line 112a and word line 110a, and phase change memory cell 104b is electrically coupled to bit line 112a and word line 110b. Phase change memory cell 104c is electrically coupled to bit line 112b and word line 110a, and phase change memory cell 104d is electrically coupled to bit line 112b and word line 110b.

Each phase change memory cell 104 includes a phase change element 106 and a diode 108. Phase change memory cell 104a includes phase change element 106a and diode

108a. One side of phase change element 106a is electrically coupled to bit line 112a, and the other side of phase change element 106a is electrically coupled to one side of diode 108a. The other side of diode 108a is electrically coupled to word line 110a. In another embodiment, the polarity of diode 108a is reversed.

Phase change memory cell 104b includes phase change element 106b and diode 108b. One side of phase change element 106b is electrically coupled to bit line 112a, and the other side of phase change element 106b is electrically coupled to one side of diode 108b. The other side of diode 108b is electrically coupled to word line 110b.

Phase change memory cell 104c includes phase change element 106c and diode 108c. One side of phase change element 106c is electrically coupled to bit line 112b and the other side of phase change element 106c is electrically coupled to one side of diode 108c. The other side of diode 108c is electrically coupled to word line 110a.

Phase change memory cell 104d includes phase change element 106d and diode 108d. One side of phase change element 106d is electrically coupled to bit line 112b and the other side of phase change element 106d is electrically coupled to one side of diode 108d. The other side of diode 108d is electrically coupled to word line 110b.

In another embodiment, each phase change element 106 is electrically coupled to a word line 110 and each diode 108 is electrically coupled to a bit line 112. For example, for phase change memory cell 104a, one side of phase change element 106a is electrically coupled to word line 110a. The other side of phase change element 106a is electrically coupled to one side of diode 108a. The other side of diode 108a is electrically coupled to bit line 112a.

In one embodiment, each phase change element 106 comprises a phase change material that may be made up of a variety of materials in accordance with the present invention. Generally, chalcogenide alloys that contain one or more elements from Group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element may be changed from an amorphous state to a crystalline state or from a crystalline state to an amorphous state under the influence of temperature change. The amount of crystalline material coexisting with amorphous material in the phase change material of one of the phase change elements thereby defines two or more states for storing data within memory device 100. In the amorphous state, a phase change material exhibits significantly higher resistivity than in the crystalline state. Therefore, the two or more states of the phase change elements differ in their electrical resistance. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that are assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 102 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

In one embodiment, during a set operation of phase change memory cell 104a, one or more set current or voltage pulses are selectively enabled by write circuit 124 and sent through bit line 112a to phase change element 106a, thereby heating phase change element 106a above its crystallization temperature (but usually below its melting temperature). In this way, phase change element 106a reaches its crystalline state or a partially crystalline and partially amorphous state during this set operation.

During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state.

Phase change memory cells 104b-104d and other phase change memory cells 104 in memory array 102 are set and reset similarly to phase change memory cell 104a using a similar current or voltage pulse. In other embodiments, for other types of resistive memory cells, write circuit 124 provides suitable programming pulses to program the resistive memory cells 104 to the desired state.

Figure 3A:
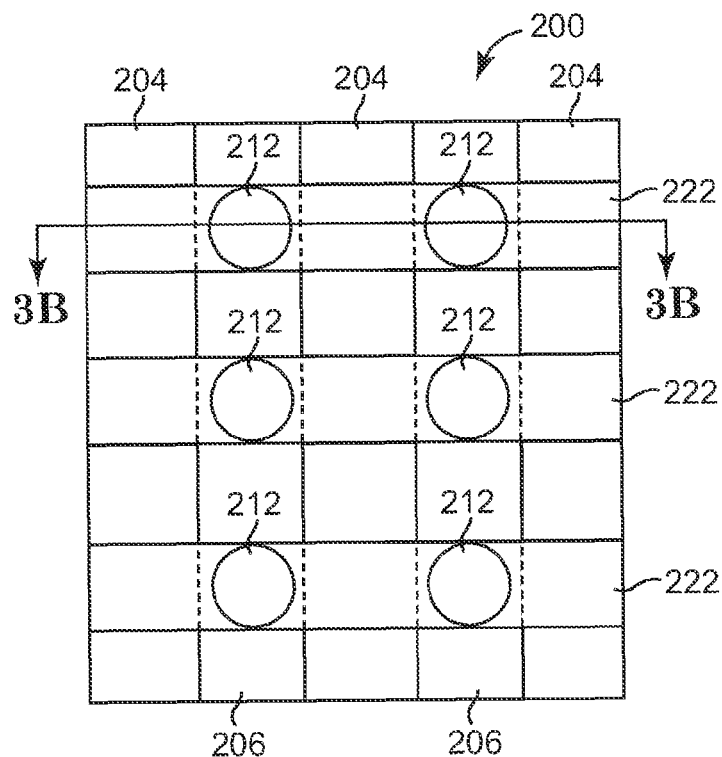
FIG. 3A illustrates a top view of one embodiment of a memory array.
Figure 3B:
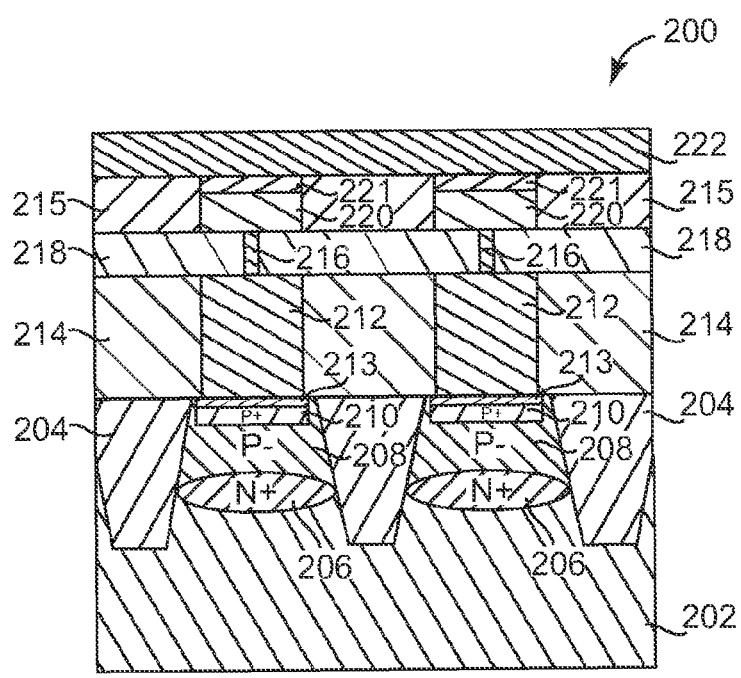
FIG. 3B illustrates a cross-sectional view of one embodiment of the memory array.

FIG. 3A illustrates a top view and FIG. 3B illustrates a cross-sectional view of one embodiment of a memory array 200. In one embodiment, memory array 200 provides memory array 102 previously described and illustrated with reference to FIG. 2. Memory array 200 includes a P− substrate 202 or P− well, shallow trench isolation (STI) 204, N− or N+ word lines 206, P− regions 208, P+ regions 210, silicide layers 213, contacts 212, bottom electrodes 216, phase change elements 220, top electrodes 221, bit lines 222, and dielectric material 214, 215, and 218. N+ word lines 206 and P− regions 208 form vertical diodes 108. In another embodiment, memory array 200 includes a P− substrate 202, N− substrate, or N− well, P− or P+ word lines 206, N− regions 208, and N+ regions 210, such that the polarity of diodes 108 is reversed.

STI 204 is formed in P− substrate 202 and includes $SiO_2$, $SiO_x$, SiN, fluorinated silica glass (FSG), boro-phosphorous silicate glass (BPSG), boro-silicate glass (BSG), or other suitable dielectric material. Word lines 206 include an N+ region formed using ion implantation into P− substrate 202 between STI 204. The top of each word line 206 contacts the bottom of a P− region 208. Each P− region 208 is also formed using ion implantation into the P− substrate between STI 204. The top of each P− region 208 contacts the bottom of a P+ region 210. Each P+ region 210 is also formed using ion implantation into the P− substrate between STI 204. The top of each P+ region 210 contacts the bottom of a silicide layer 213. Each silicide layer 213 includes CoSi, TiSi, NiSi, NiPtSi, TaSi, or other suitable silicide. The top of each silicide layer 213 contacts the bottom of a contact 212. Each contact 212 includes W, Cu, Al, or other suitable contact material. Dielectric material 214 laterally surrounds contacts 212. Dielectric material 215 laterally surrounds phase change elements 220 and top electrodes 221. Dielectric materials 214 and 215 include $SiO_2$, $SiO_x$, SiN, FSG, BPSG, BSG, or other suitable dielectric material.

The top of each contact 212 contacts the bottom of a bottom electrode 216. Each bottom electrode 216 includes TiN, TaN, W, Al, Ti, Ta, TiSiN, TaSiN, TiAlN, TaAlN, Cu, WN, C, or other suitable electrode material. Bottom electrodes 216 are laterally surrounded by dielectric material 218. Dielectric material 218 includes SiN, $SiO_2$, $SiO_xN$, or other suitable dielectric material. The top of each bottom electrode 216 contacts the bottom of a phase change element 220. In one embodiment, phase change elements 220 have a greater cross-sectional width than bottom electrodes 220. Each phase change element 220 provides a storage location for storing one or more bits of data. The active or phase change region of each phase change element 220 is at the interface between each phase change element 220 and a bottom electrode 216. The top of each phase change element 220 contacts the bottom of a top electrode 221. Each top electrode 221 includes TiN, TaN, W, Al, Ti, Ta, TiSiN, TaSiN, TiAlN, Cu, WN, C, or other suitable electrode material.

In this embodiment, bottom electrodes 216, phase change elements 220, and top electrodes 221 are arranged in a mushroom cell configuration. In other embodiments, bottom electrodes 216, phase change elements 220, and top electrodes 221 are arranged in other suitable configurations, such as a pore cell configuration. The top of each top electrode 221 contacts the bottom of a bit line 222. Each bit line 222 includes W, Cu, Al, or other suitable material. In one embodiment, bit lines 222 are perpendicular to N+ word lines 206.

The current path through each memory cell of memory array 200 is from bit line 222 through a top electrode 221 and a phase change element 220 to a bottom electrode 216. From the bottom electrode 216, the current flows through a contact 212, a silicide layer 213, and a P+ region 210 through the diode formed by a P− region 208 and an N+ word line 206. The cross-sectional width of the interface area between each phase change element 220 and each bottom electrode 216 defines the current density through the interface and thus the power needed to program each memory cell. By reducing the cross-sectional width of the interface area, the current density is locally increased, thus reducing the power used to program each memory cell.

During operation of each memory cell, current or voltage pulses are applied between a bit line 222 and a word line 206 to program a memory cell. During a set operation of a memory cell, one or more set current or voltage pulses are selectively enabled by write circuit 124 and sent through a bit line 222 to a top electrode 221. From the top electrode 221, the set current or voltage pulses pass through a phase change element 220 thereby heating the phase change material above its crystallization temperature (but usually below its melting temperature). In this way, the phase change material reaches a crystalline state or a partially crystalline and partially amorphous state during the set operation.

During a reset operation of a memory cell, a reset current or voltage pulse is selectively enabled by write circuit 124 and sent through a bit line 222 to a top electrode 221. From the top electrode 221, the reset current or voltage pulse passes through phase change element 220. The reset current or voltage quickly heats the phase change material above its melting temperature. After the current or voltage pulse is turned off, the phase change material quickly quench cools into an amorphous state or a partially amorphous and partially crystalline state.

The following FIGS. 4A-10C illustrate embodiments for fabricating a memory array, such as memory array 200 previously described and illustrated with reference to FIGS. 3A and 3B.

Figure 4A:
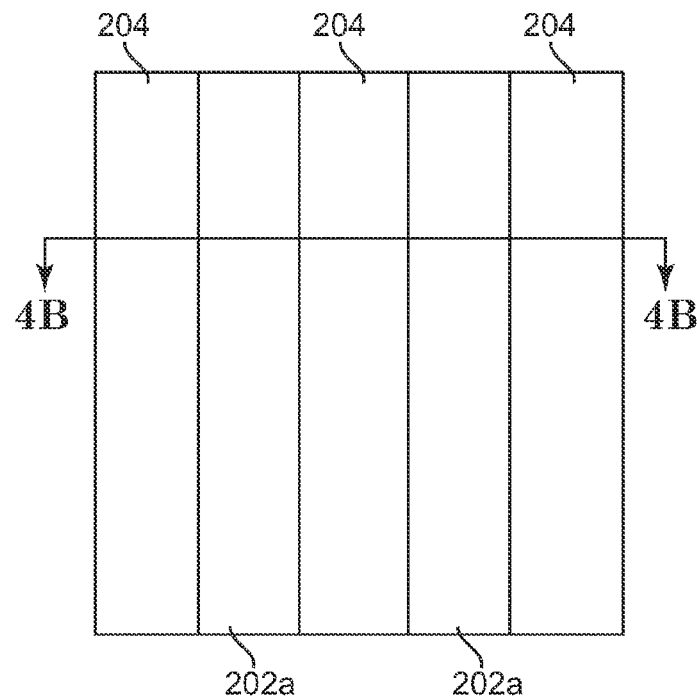
FIG. 4A illustrates a top view of one embodiment of a substrate with isolation regions.
Figure 4B:
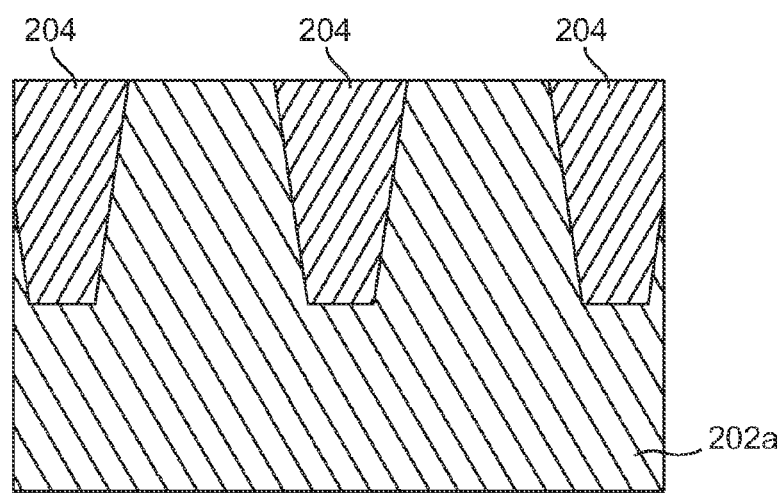
FIG. 4B illustrates a cross-sectional view of one embodiment of the substrate with isolation regions.

FIG. 4A illustrates a top view and FIG. 4B illustrates a cross-sectional view of one embodiment of a substrate 202a with isolation regions 204. In one embodiment, a P− silicon substrate is provided. In other embodiments, another suitable substrate is provided. Openings are etched into the substrate to provide substrate 202a. In one embodiment, the openings are trenches that extend in rows or columns across the substrate. A dielectric material, such as $SiO_2$, $SiO_x$, SiN, FSG, BPSG, BSG, or other suitable dielectric material is deposited over the etched substrate and into the openings. The dielectric material is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique. The dielectric material is then planarized to expose substrate 202a to provide STI or isolation regions 204. The dielectric material is planarized using chemical mechanical planarization (CMP) or another suitable planarization technique.

Figure 5A:
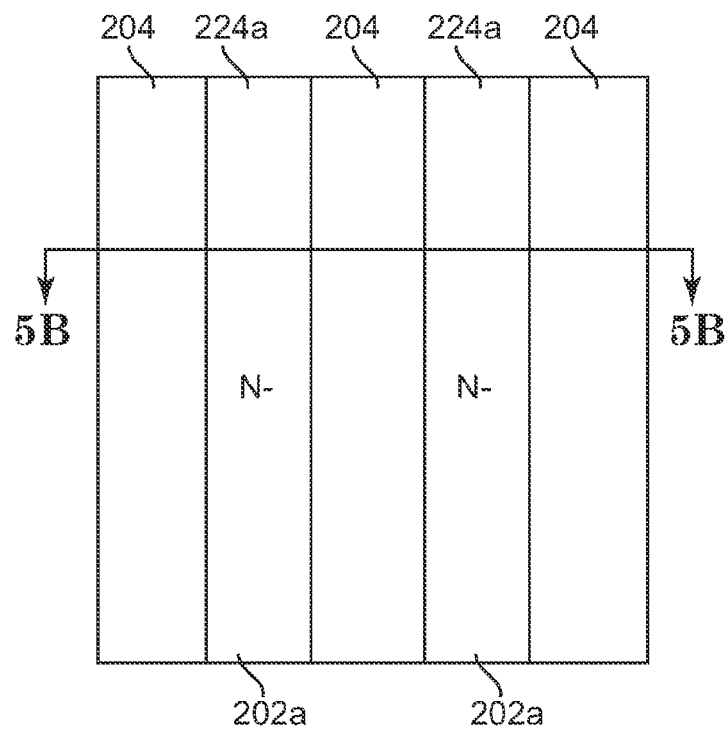
FIG. 5A illustrates a top view of one embodiment of the substrate with isolation regions, N+ word lines, and N− regions.
Figure 5B:
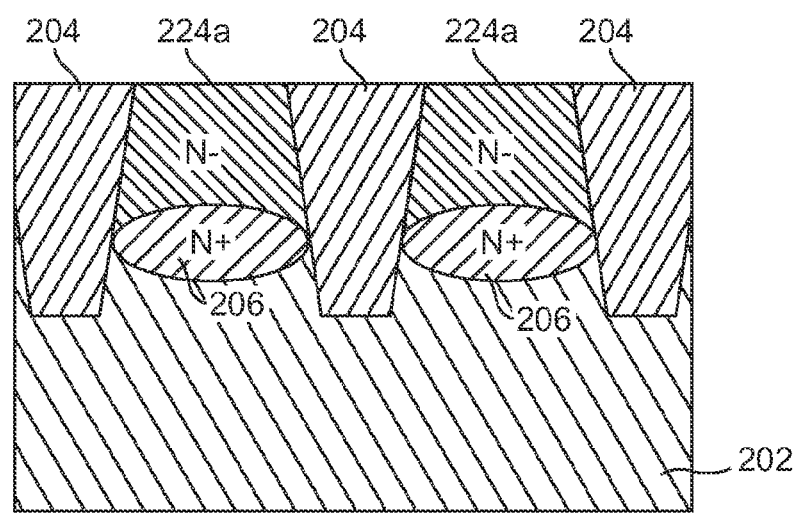
FIG. 5B illustrates a cross-sectional view of one embodiment of the substrate with isolation regions, N+ word lines, and N− regions.

FIG. 5A illustrates a top view and FIG. 5B a cross-sectional view of one embodiment of substrate 202 with isolation regions 204, N+ word lines 206, and N− regions 224a. In one embodiment, a protective oxide layer (not shown), such as $SiO_2$, is deposited over substrate 202a and isolation regions 204. With the protective oxide layer deposited, substrate 202a is implanted with arsenic, phosphorus, or other suitable implants to provide N+ word lines 206, N− regions 224a over N+ word lines 206, and substrate 202.

Figure 6A:
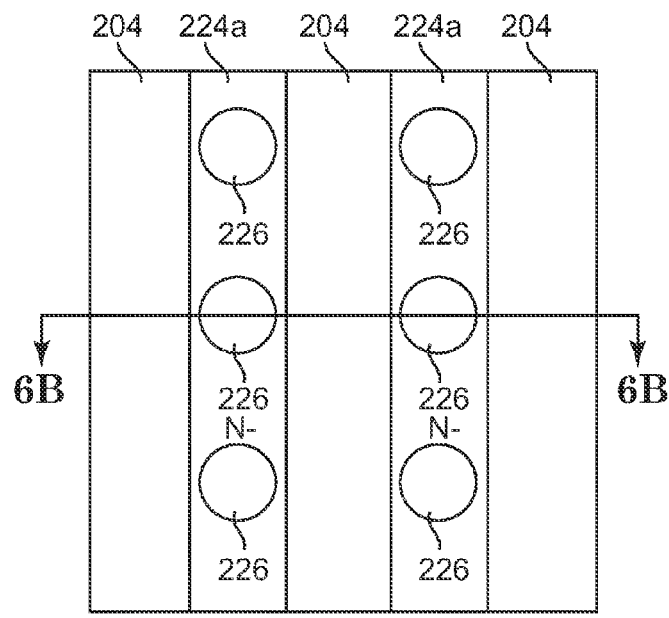
FIG. 6A illustrates a top view of one embodiment of the substrate with isolation regions, N+ word lines, N− regions, and dielectric material.
Figure 6B:
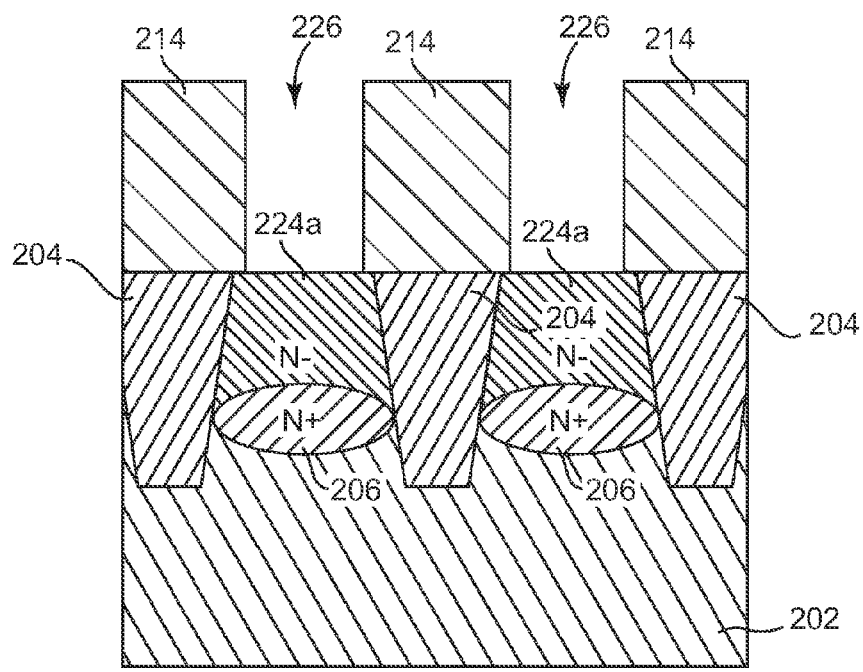
FIG. 6B illustrates a cross-sectional view of one embodiment of the substrate with isolation regions, N+ word lines, N− regions, and dielectric material.

FIG. 6A illustrates a top view and FIG. 6B illustrates a cross-sectional view of one embodiment of substrate 202 with isolation regions 204, N+ word lines 206, N− regions 224a, and dielectric material 214. A dielectric material, such as $SiO_2$, $SiO_x$, SiN, FSG, BPSG, BSG, or other suitable dielectric material is deposited over substrate 202 to provide a dielectric material layer. The dielectric material layer is deposited using CVD, HDP-CVD, ALD, MOCVD, PVD, JVD, spin on, or other suitable deposition technique. The dielectric material layer is then etched to provide openings 226 exposing portions of N− regions 224a and to provide dielectric material 214. In one embodiment, openings 226 are cylindrical openings.

Figure 7A:
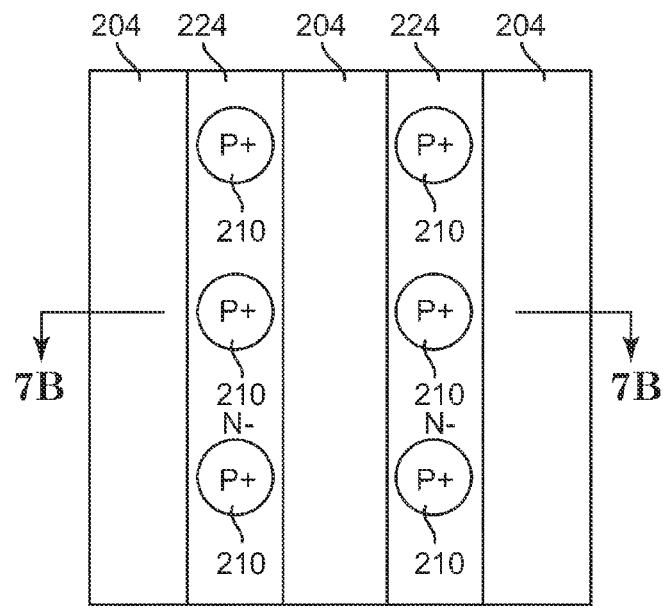
FIG. 7A illustrates a top view of one embodiment of the substrate with isolation regions, N+ word lines, N− regions, P− regions, P+ regions, silicide layers, and dielectric material.
Figure 7B:
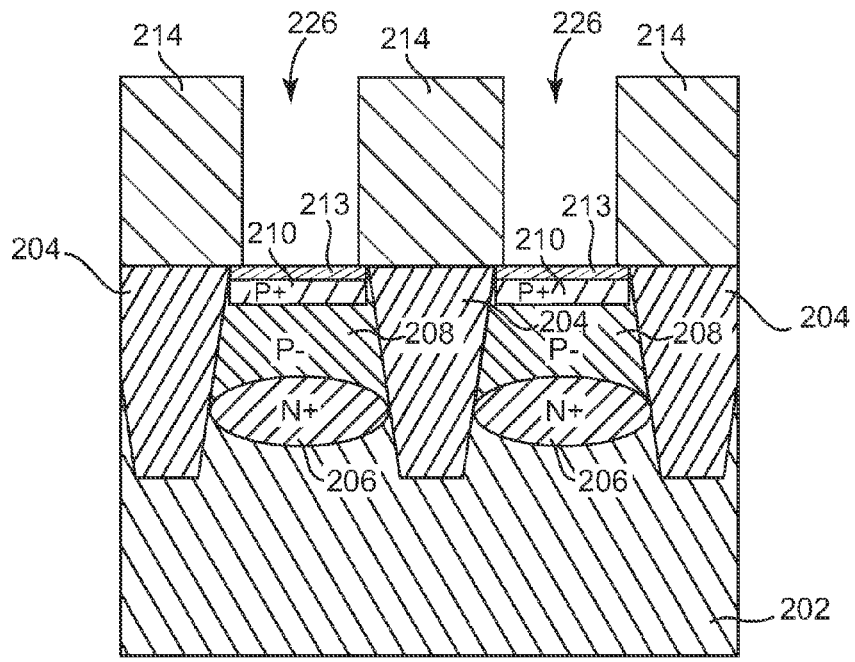
FIG. 7B illustrates a cross-sectional view of one embodiment of the substrate with isolation regions, N+ word lines, N− regions, P− regions, P+ regions, silicide layers, and dielectric material.

FIG. 7A illustrates a top view and FIG. 7B illustrates a cross-sectional view of one embodiment of substrate 202 with isolation regions 204, N+ word lines 206, N− regions 224, P− regions 208, P+ regions 210, silicide layers 213, and dielectric material 214. In one embodiment, a protective oxide layer (not shown), such as $SiO_2$, is deposited over exposed portions of N− regions 224a. With the protective oxide layer deposited, the portions of N− regions 224a that are aligned with openings 226 are implanted with boron or other suitable implants to provide P− regions 208 and P+ regions 210 over P− regions 208. N+ word lines 206 and P− regions 208 form vertical diodes 108. The protective oxide layer is then removed.

Silicide layers 213 are then formed over P+ regions 210. In one embodiment, silicide layers 213 are formed by bringing a suitable metal such as Co, Ni, or NiPt into contact with P+ region 210 and annealing. The unreacted metal is then removed to provide silicide layers 213. In another embodiment, silicide layers 213 are formed using the metal to be used to form contacts 212. In this embodiment, the unreacted metal is not removed.

Figure 8A:
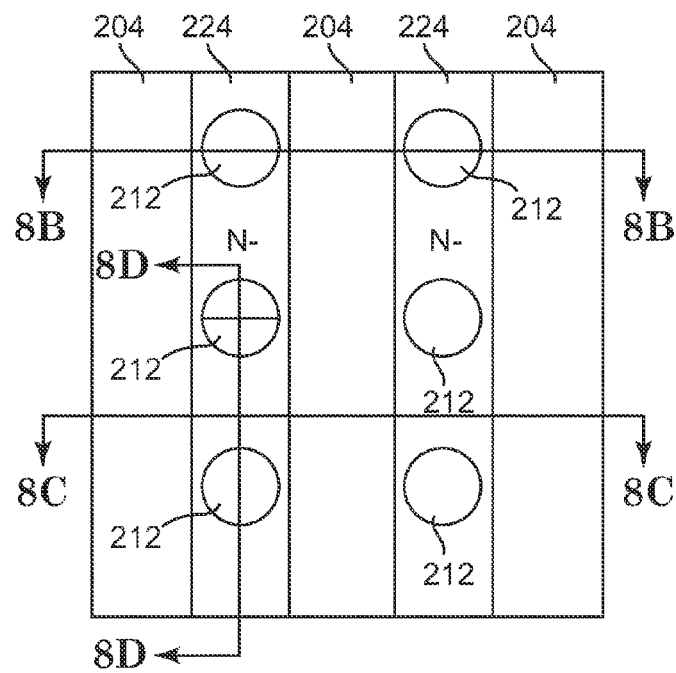
FIG. 8A illustrates a top view of one embodiment of the substrate with isolation regions, N+ word lines, N− regions, P− regions, P+ regions, silicide layers, dielectric material, and contacts.
Figure 8B:
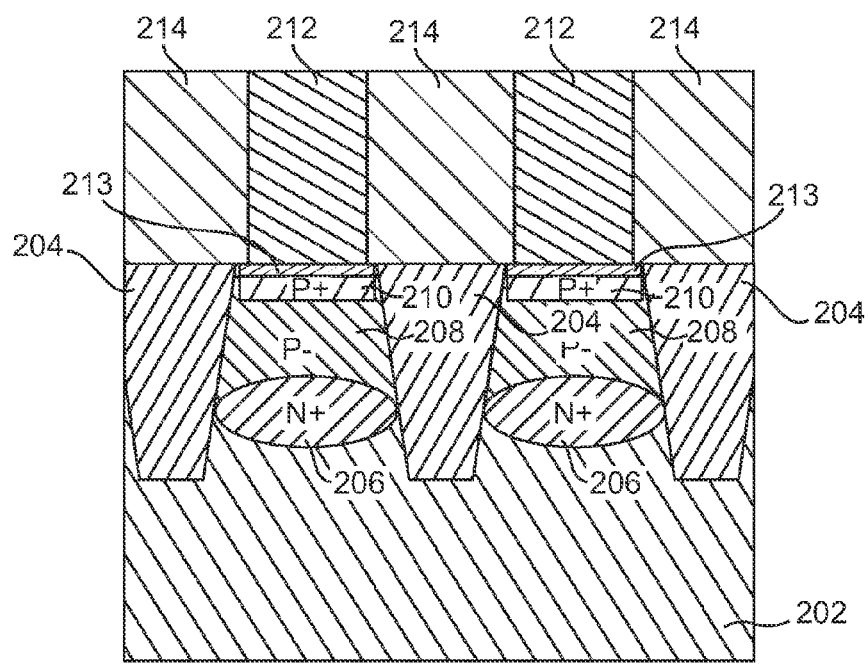
FIG. 8B illustrates a cross-sectional view of one embodiment of the substrate with isolation regions, N+ word lines, N− regions, P− regions, P+ regions, silicide layers, dielectric material, and contacts.
Figure 8C:
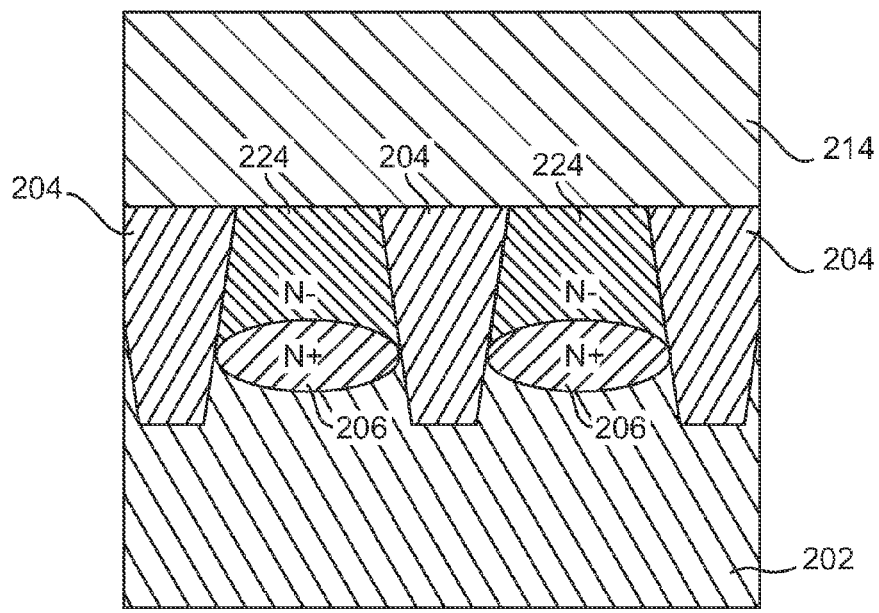
FIG. 8C illustrates another cross-sectional view of one embodiment of the substrate with isolation regions, N+ word lines, N− regions, P− regions, P+ regions, silicide layers, dielectric material, and contacts.
Figure 8D:
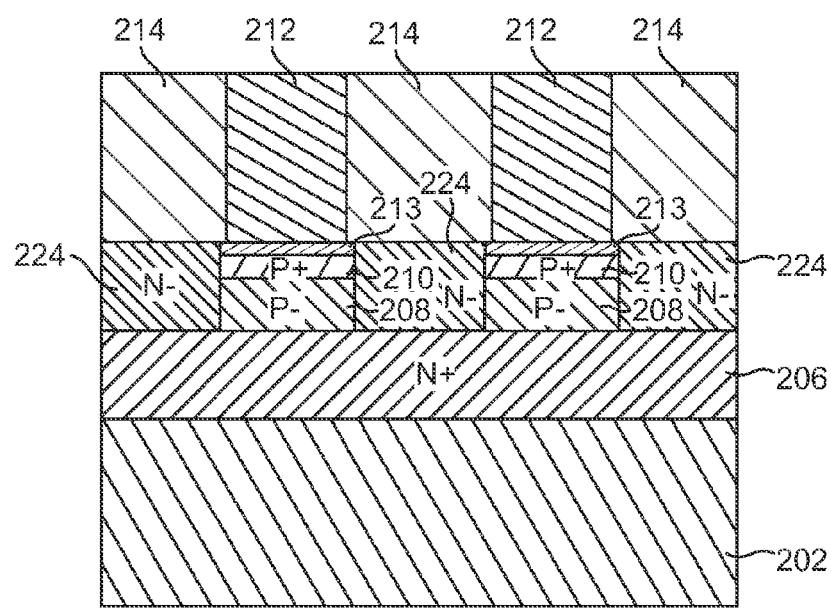
FIG. 8D illustrates another cross-sectional view of one embodiment of the substrate with isolation regions, N+ word lines, N− regions, P− regions, P+ regions, silicide layers, dielectric material, and contacts.

FIG. 8A illustrates a top view and FIGS. 8B-8D illustrate cross-sectional views of one embodiment of substrate 202 with isolation regions 204, N+ word lines 206, N− regions 224, P− regions 208, P+ regions 210, silicide layers 213, dielectric material 214, and contacts 212. A contact material, such as W, Cu, Al, or other suitable contact material is deposited over exposed portions of dielectric material 214 and P+ regions 210 to provide a contact material layer. The contact material layer is deposited using CVD, HDP-CVD, ALD, MOCVD, PVD, JVD, or other suitable deposition technique. The contact material layer is then planarized to expose dielectric material 214 to provide contacts 212. The contact material layer is planarized using CMP or another suitable planarization technique. Additional suitable processes are then used to fabricate bottom electrodes 216, phase change elements 220, top electrodes 221, and bit lines 222 of memory array 200 as previously described and illustrated with reference to FIGS. 3A and 3B.

Figure 9:
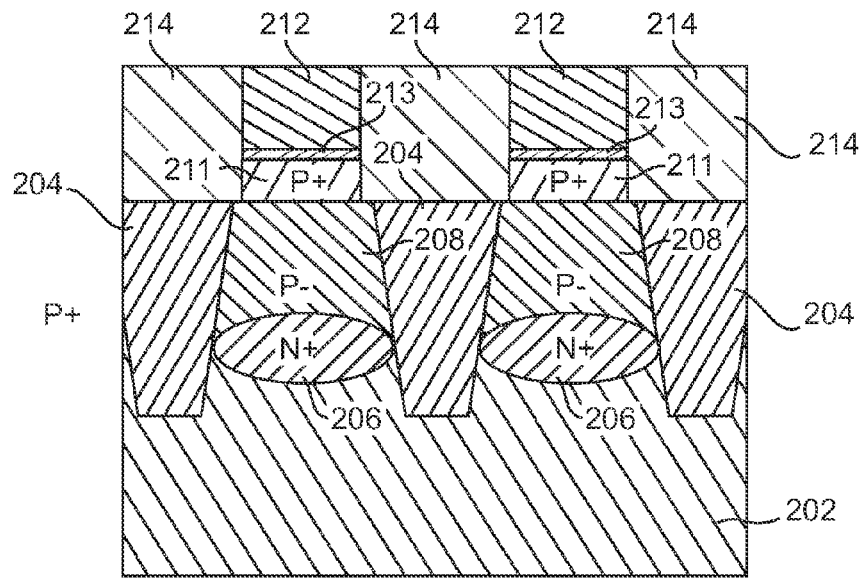
FIG. 9 illustrates a cross-sectional view of another embodiment of the substrate with isolation regions, N+ word lines, N− regions, P− regions, P+ regions, silicide layers, dielectric material, and contacts.

FIG. 9 illustrates a cross-sectional view of another embodiment of substrate 202 with isolation regions 204, N+ word lines 206, P− regions 208, P+ regions 211, silicide layers 213, dielectric material 214, and contacts 212. In this embodiment, instead of fabricating P+ regions 210 using ion implantation as previously described and illustrated with reference to FIGS. 7A and 7B, P+ regions 210 are replaced with P+ regions 211. In one embodiment, P+ regions 211 are fabricated by depositing P+ semiconductor material into openings 226 after implanting N− regions 224a to provide P− regions 208. In another embodiment, P+ regions 211 are fabricated using selective epitaxy in openings 226 after implanting N− regions 224a to provide P− regions 208.

Figure 10A:
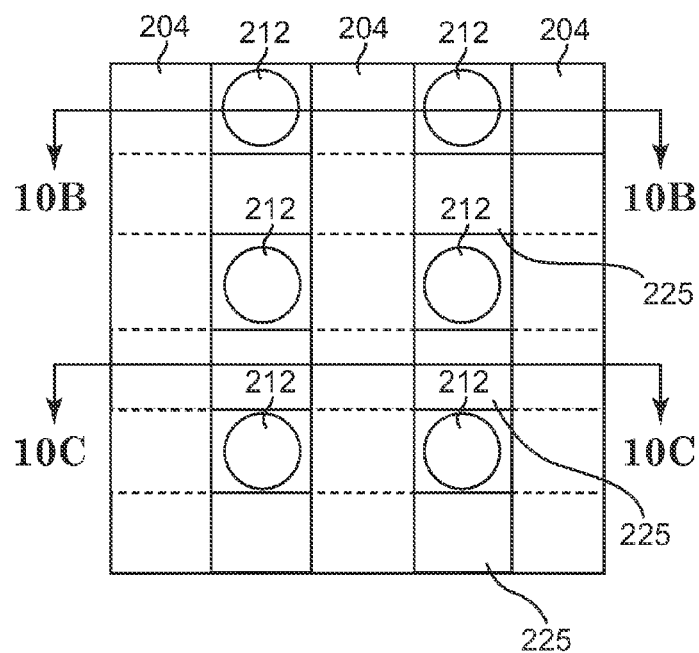
FIG. 10A illustrates a top view of another embodiment of the substrate with isolation regions, N+ word lines, P− regions, P+ regions, silicide layers, dielectric material, and contacts.
Figure 10B:
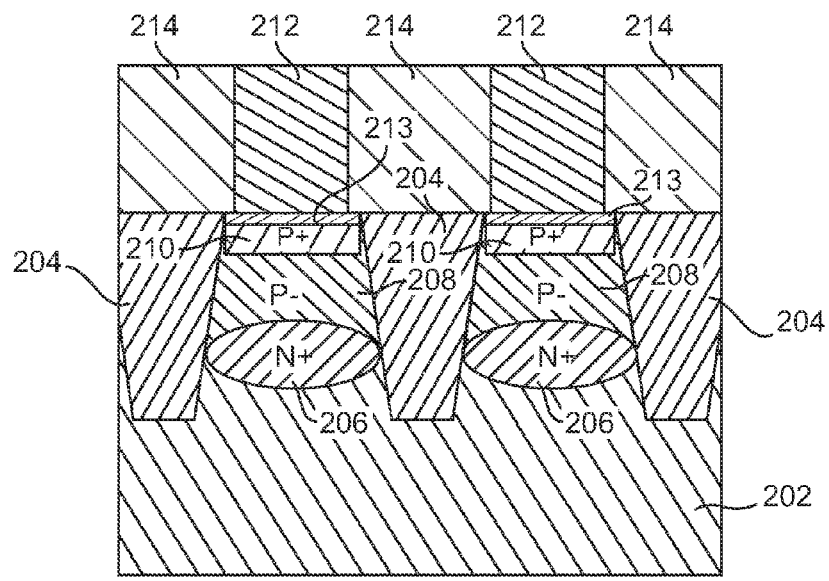
FIG. 10B illustrates a cross-sectional view of one embodiment of the substrate with isolation regions, N+ word lines, P− regions, P+ regions, silicide layers, dielectric material, and contacts.
Figure 10C:
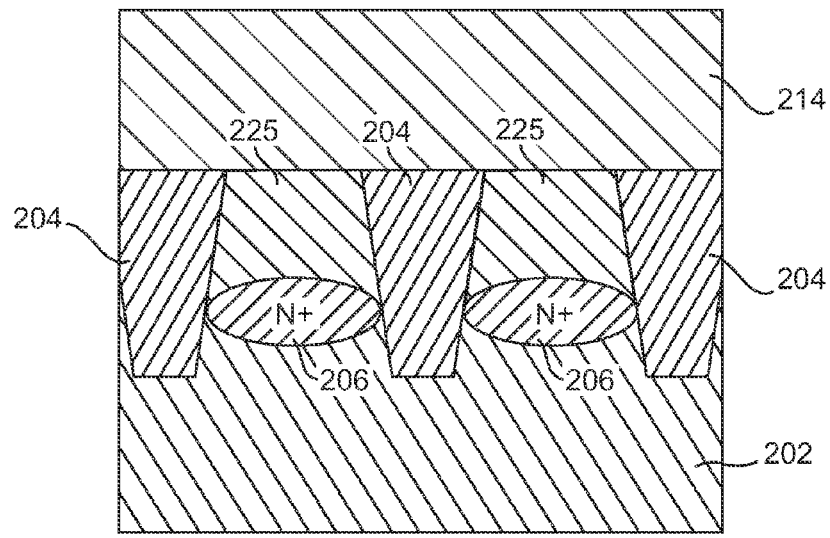
FIG. 10C illustrates another cross-sectional view of one embodiment of the substrate with isolation regions, N+ word lines, P− regions, P+ regions, silicide layers, dielectric material, and contacts.

FIG. 10A illustrates a top view and FIGS. 10B and 10C illustrate cross-sectional views of another embodiment of substrate 202 with isolation regions 204 and 225, N+ word lines 206, P− regions 208, P+ regions 210, silicide layers 213, dielectric material 214, and contacts 212. In this embodiment, N− regions 224 are replaced with isolations regions 225. Isolation regions 225 include $SiO_2$, $SiO_x$, SiN, FSG, BPSG, BSG, or other suitable dielectric material. Isolation regions 225 are fabricated by etching trenches in substrate 202a perpendicular to the trenches etched to form isolation regions 204 as previously described and illustrated with reference to FIGS. 4A and 4B. The trenches used to fabricate isolations regions 225 are not as deep as the trenches used to fabricate isolation regions 204.

Figure 11A:
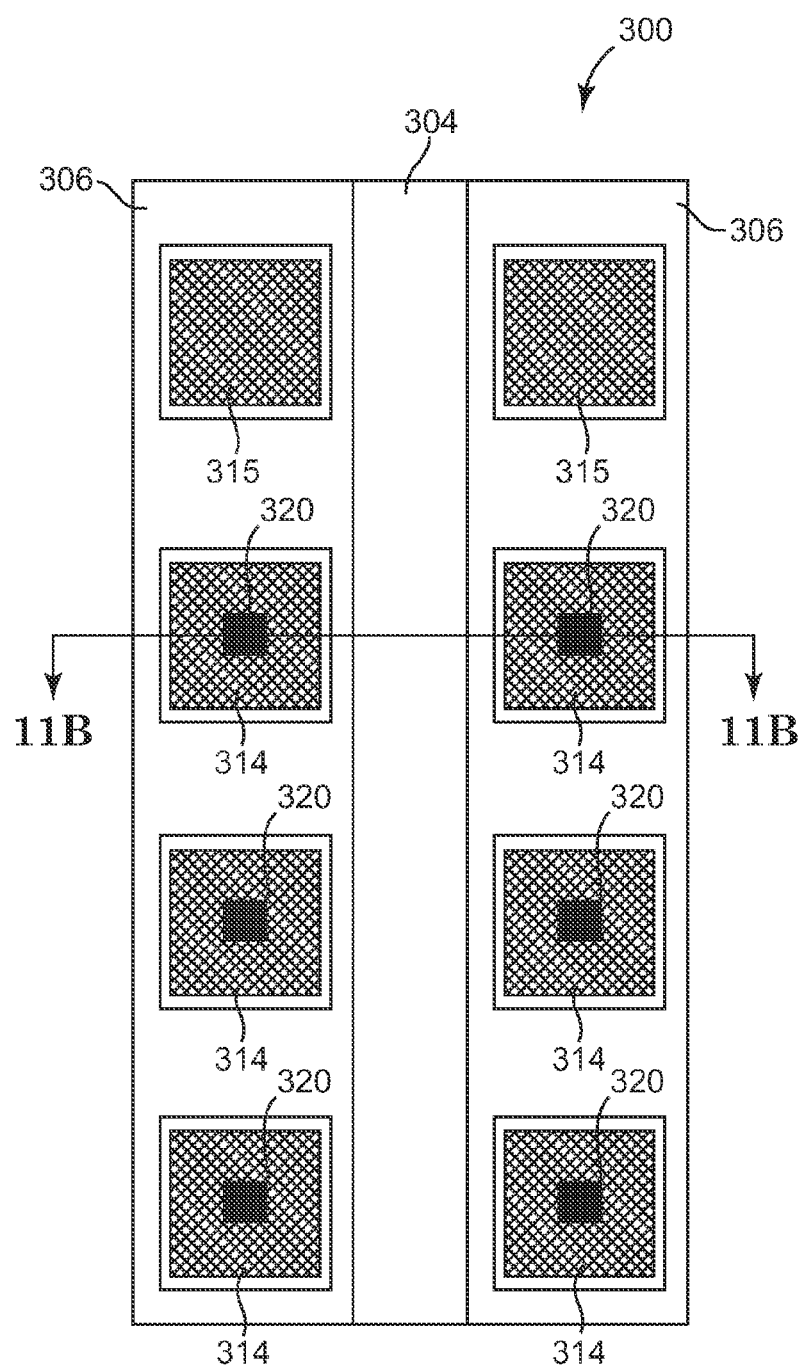
FIG. 11A illustrates a top view of another embodiment of a memory array.
Figure 11B:
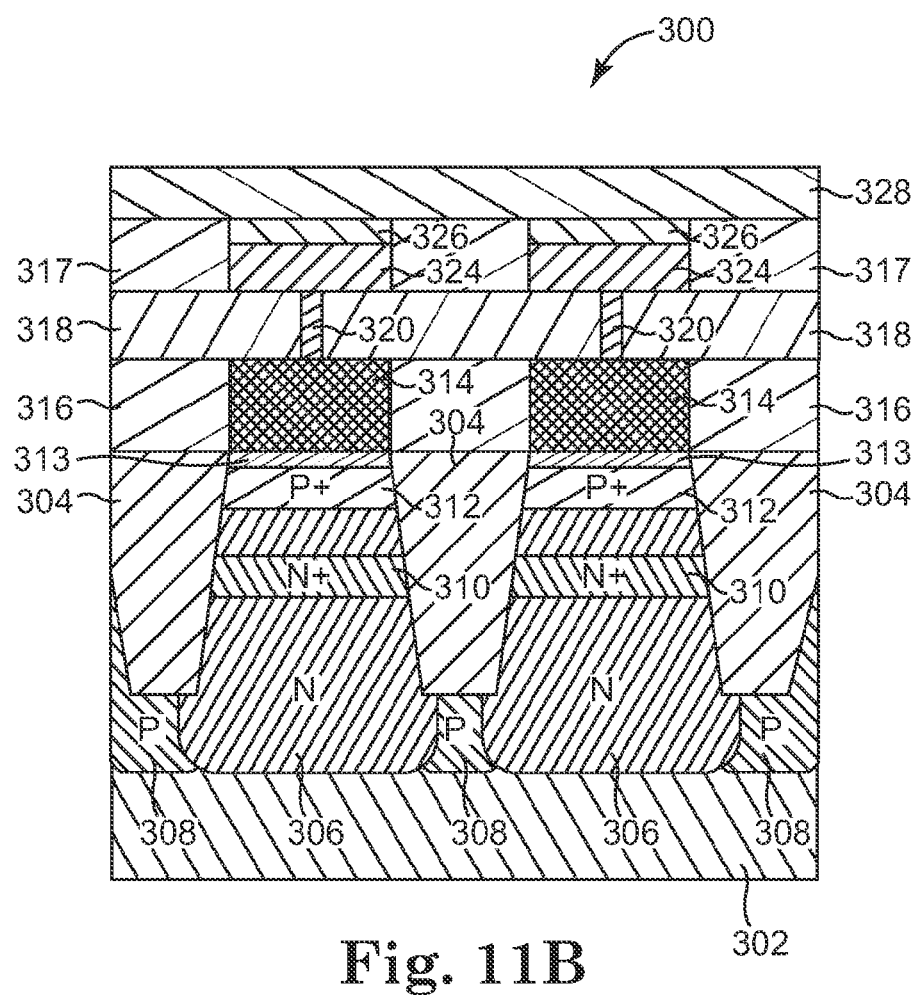
FIG. 11B illustrates a cross-sectional view of another embodiment of the memory array.

FIG. 11A illustrates a top view and FIG. 11B illustrates a cross-sectional view of another embodiment of a memory array 300. In one embodiment, memory array 300 provides memory array 102 previously described and illustrated with reference to FIG. 2. Memory array 300 includes a P− substrate 302, STI 304, N wells 306, P wells 308, N+ regions 310, P+ regions 312, silicide layers 313, contacts 314 and 315, bottom electrodes 320, phase change elements 324, top electrodes 326, bit lines 328, and dielectric material 316, 317, and 318. P+ regions 312 and N wells 306 form vertical diodes 108. In another embodiment, memory array 200 includes an N− substrate 302, P wells 306, N wells 308, P+ regions 310, and N+ regions 312, such that the polarity of diodes 108 is reversed.

STI 304 is formed in P− substrate 302 and includes $SiO_2$, $SiO_x$, SiN, FSG, BPSG, BSG, or other suitable dielectric material. N wells 306, which provide word lines, are formed using ion implantation into P− substrate 302 between STI 304. Each N+ region 310 is formed in an N well 306 using ion implantation into the N wells 306. Each P+ region 312 is also formed using ion implantation into the N wells 306. The top of each P+ region 312 contacts the bottom of a silicide layer 313. Each silicide layer 313 includes CoSi, TiSi, NiSi, NiPtSi, TaSi, or other suitable silicide. The top of each silicide layer 313 contacts the bottom of a contact 314. Each contact 314 includes W, Cu, Al, or other suitable contact material. Dielectric material 316 laterally surrounds contacts 314 and 315. Dielectric material 317 laterally surrounds phase change elements 324 and top electrodes 326. Dielectric materials 316 and 317 include $SiO_2$, $SiO_x$, SiN, FSG, BPSG, BSG, or other suitable dielectric material.

The top of each contact 314 contacts the bottom of a bottom electrode 320. Each bottom electrode 320 includes TiN, TaN, W, Al, Ti, Ta, TiSiN, TaSiN, TiAlN, TaAlN, Cu, WN, C, or other suitable electrode material. Bottom electrodes 320 are laterally surrounded by dielectric material 318. Dielectric material 318 includes SiN, $SiO_2$, $SiO_xN$, or other suitable dielectric material. The top of each bottom electrode 320 contacts the bottom of a phase change element 324. In one embodiment, phase change elements 324 have a greater cross-sectional width than bottom electrodes 320. Each phase change element 324 provides a storage location for storing one or more bits of data. The active or phase change region of each phase change element 324 is at the interface between each phase change element 324 and a bottom electrode 320. The top of each phase change element 324 contacts the bottom of a top electrode 326. Each top electrode 326 includes TiN, TaN, W, Al, Ti, Ta, TiSiN, TaSiN, TiAlN, Cu, WN, C, or other suitable electrode material.

In this embodiment, bottom electrodes 320, phase change elements 324, and top electrodes 326 are arranged in a mushroom cell configuration. In other embodiments, bottom electrodes 320, phase change elements 324, and top electrodes 326 are arranged in other suitable configurations, such as a pore cell configuration. The top of each top electrode 326 contacts the bottom of a bit line 328. Each bit line 328 includes W, Cu, Al, or other suitable material. In one embodiment, bit lines 328 are perpendicular to N wells 306. Each contact 315 contacts an N well 306. Contacts 315 reduce the resistance of the N well 306 word lines.

The current path through each memory cell of memory array 300 is from a bit line 328 through a top electrode 326 and a phase change element 324 to a bottom electrode 320. From the bottom electrode 320, the current flows through a contact 314, a silicide layer 313, and through the diode formed by a P+ region 312 and an N well 306. The cross-sectional width of the interface area between phase change element 324 and bottom electrode 320 defines the current density through the interface and thus the power needed to program each memory cell. By reducing the cross-sectional width of the interface area, the current density is increased, thus reducing the power used to program each memory cell. The memory cells of memory array 300 are programmed similarly to the memory cells of memory array 200 as previously described and illustrated with reference to FIGS. 3A and 3B.

The following FIGS. 12A-14C illustrate embodiments for fabricating a memory array, such as memory array 300 previously described and illustrated with reference to FIGS. 11A and 11B. In one embodiment, the diodes for the memory array are fabricated at the same time as peripheral silicon complementary metal-oxide-semiconductor (CMOS) logic devices are fabricated during front end of line (FEOL) processes. Therefore, the diodes are on the same level as the CMOS logic devices.

Figure 12A:
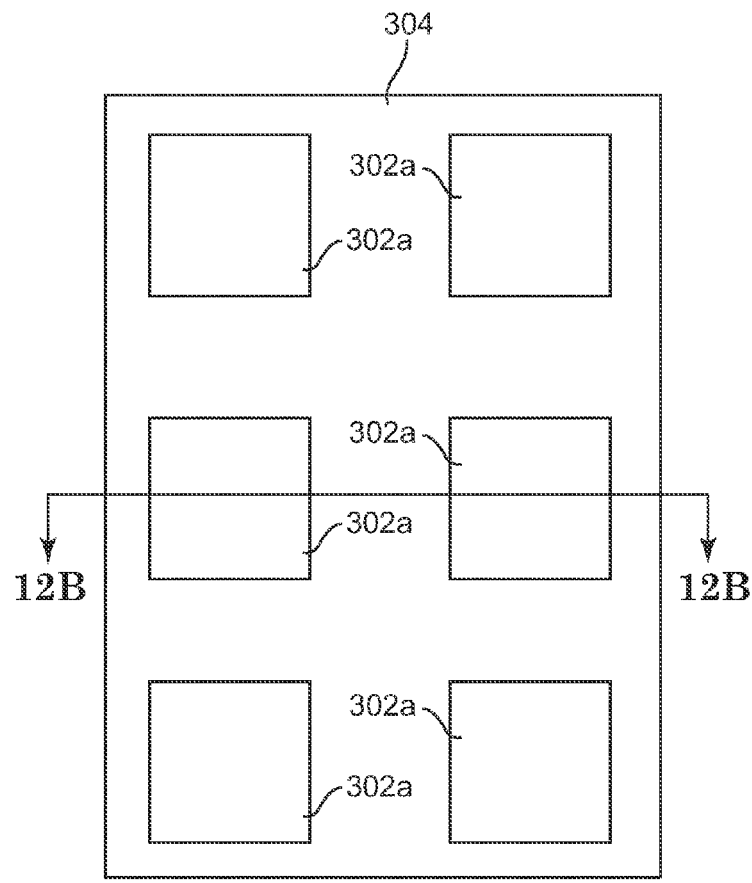
FIG. 12A illustrates a top view of one embodiment of a substrate with isolation regions.
Figure 12B:
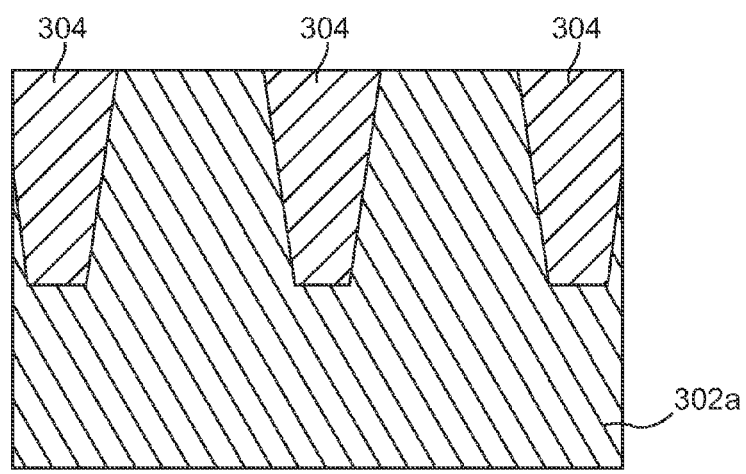
FIG. 12B illustrates a cross-sectional view of one embodiment of the substrate with isolation regions.

FIG. 12A illustrates a top view and FIG. 12B illustrates a cross-sectional view of one embodiment of a substrate 302a with isolation regions 304. In one embodiment, a P− silicon substrate is provided. In other embodiments, another suitable substrate is provided. Openings are etched into the substrate to provide substrate 302a. In one embodiment, the openings are perpendicular trenches that extend in rows and columns across the substrate. A dielectric material, such as $SiO_2$, $SiO_x$, SiN, FSG, BPSG, BSG, or other suitable dielectric material is deposited over the etched substrate and into the openings. The dielectric material is deposited using CVD, HDP-CVD, ALD, MOCVD, PVD, JVD, or other suitable deposition technique. The dielectric material is then planarized to expose substrate 302a to provide STI or isolation regions 304. The dielectric material is planarized using CMP or another suitable planarization technique.

Figure 13A:
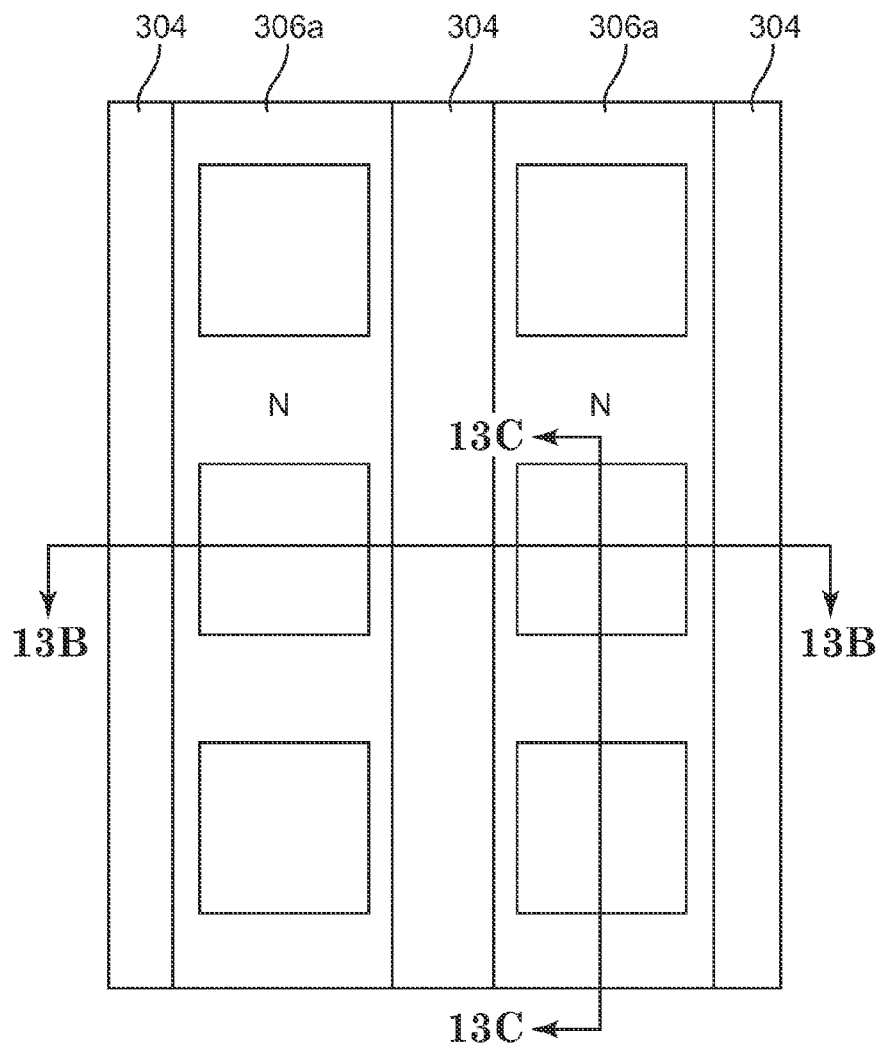
FIG. 13A illustrates a top view of one embodiment of the substrate with isolation regions, N wells, and P wells.
Figure 13B:
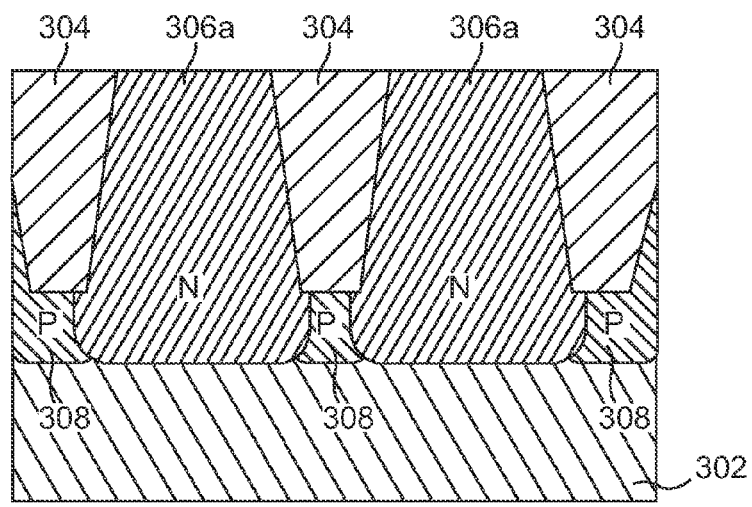
FIG. 13B illustrates a cross-sectional view of one embodiment of the substrate with isolation regions, N wells, and P wells.
Figure 13C:
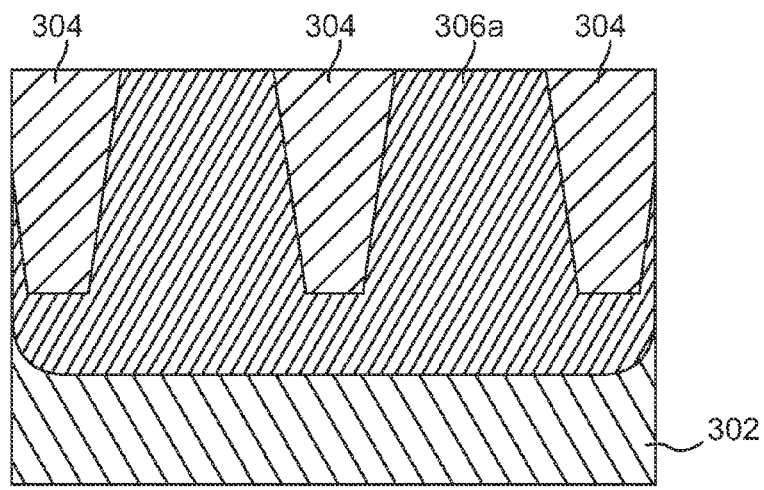
FIG. 13C illustrates another cross-sectional view of one embodiment of the substrate with isolation regions, N wells, and P wells.

FIG. 13A illustrates a top view and FIGS. 13B and 13C illustrate cross-sectional views of one embodiment of substrate 302 with isolation regions 304, N wells 306a, and P wells 308. In one embodiment, a protective oxide layer (not shown), such as $SiO_2$, is deposited over substrate 302a and isolation regions 304. With the protective oxide layer deposited, substrate 302a is implanted with arsenic, phosphorus, or other suitable implants to provide N wells 306a and with boron or other suitable implants to provide P wells 308. In one embodiment, N wells 306a are optionally implanted to provide N+ adjustments.

Figure 14A:
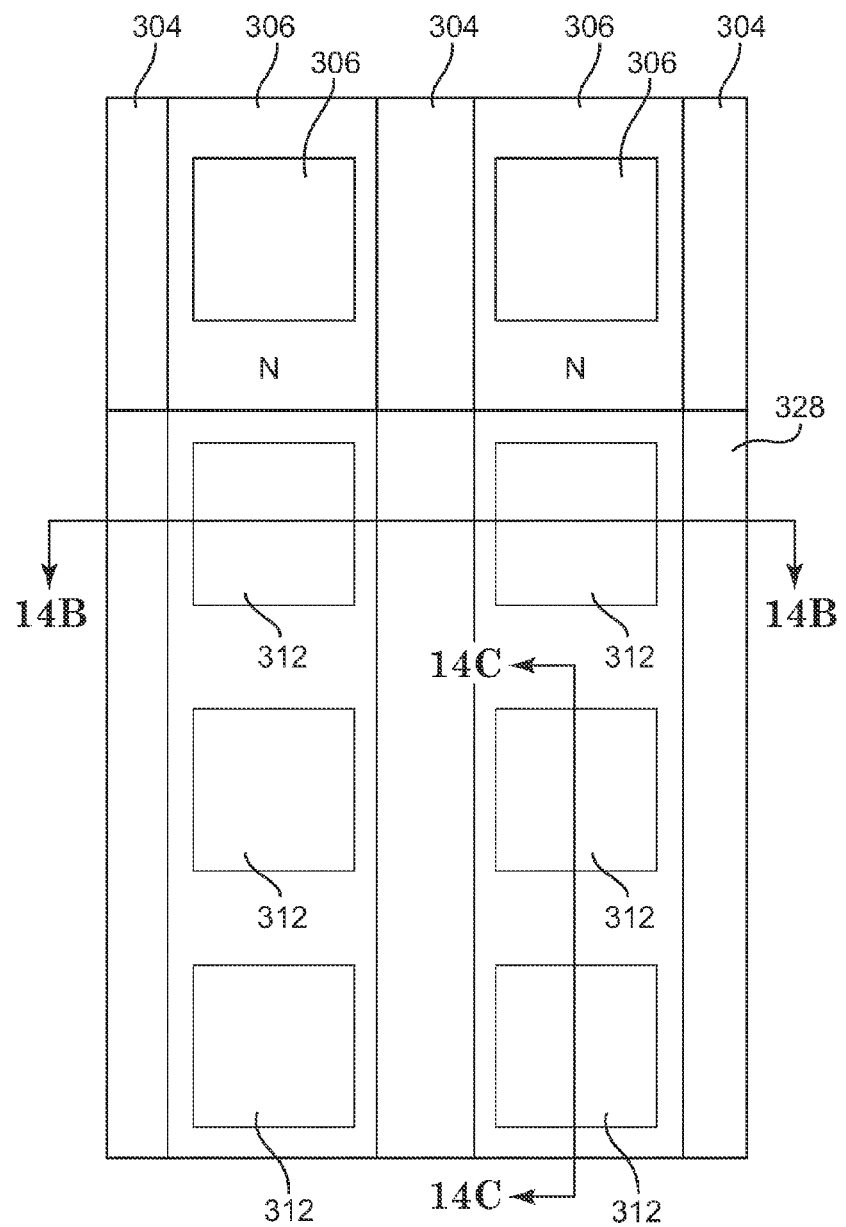
FIG. 14A illustrates a top view of one embodiment of the substrate with isolation regions, N wells, P wells, N+ regions, and P+ regions.
Figure 14B:
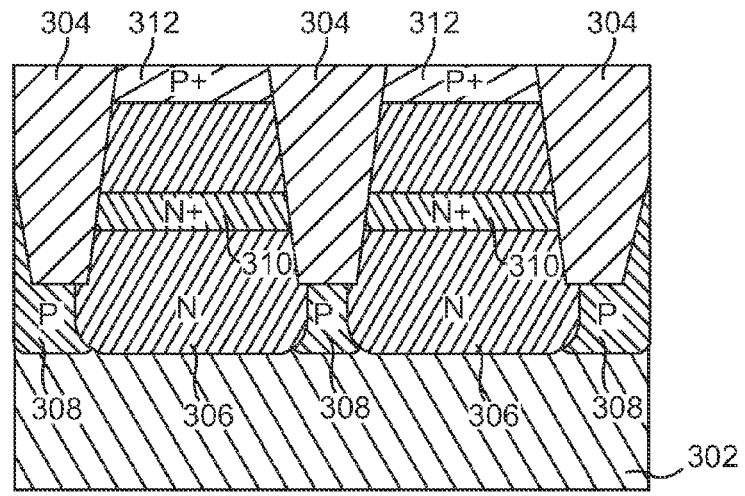
FIG. 14B illustrates a cross-sectional view of one embodiment of the substrate with isolation regions, N wells, P wells, N+ regions, and P+ regions.
Figure 14C:
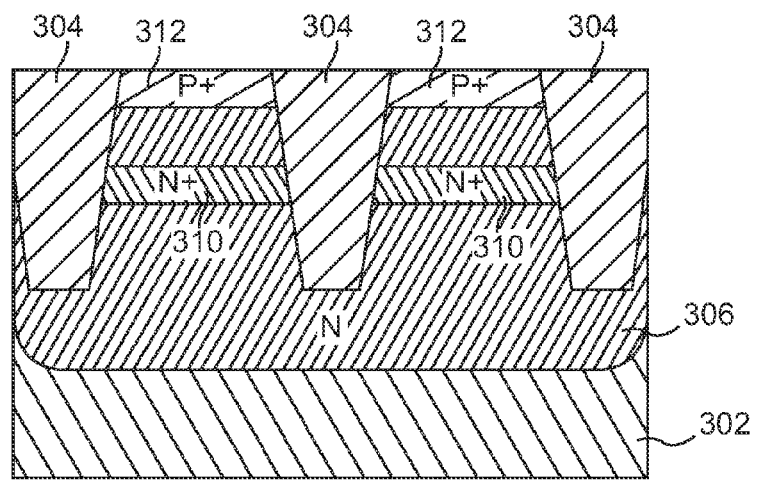
FIG. 14C illustrates another cross-sectional view of one embodiment of the substrate with isolation regions, N wells, P wells, N+ regions, and P+ regions.

FIG. 14A illustrates a top view and FIGS. 14B and 14C illustrate cross-sectional views of one embodiment of substrate 302 with isolation regions 304, N wells 306, P wells 308, N+ regions 310, and P+ regions 312. Each N well 306a in region 328 is implanted with arsenic, phosphorus, or other suitable implants to provide N+ regions 310 and with boron or other suitable implants to provide P+ regions 312. P+ regions 312 and N wells 306 form vertical diodes 108. Additional suitable processes are then used to fabricate silicide layers 313, contacts 314 and 315, bottom electrodes 320, phase change elements 324, top electrodes 326, and bit lines 328 of memory array 300 as previously described and illustrated with reference to FIGS. 11A and 11B.

Embodiments provide arrays of diode selected resistive or resistivity changing memory cells. The diodes are fabricated in a substrate using ion implantation. The diodes are aligned with and coupled to contact plugs that couple the diodes to resistive memory elements. The diodes enable the fabrication of a memory array have a greater density than typical memory arrays including diodes fabricated using other processes. In addition, no additional lithography masks are needed to fabricate the diodes when compared to the logic process, thereby reducing the fabrication costs.

While the specific embodiments described herein substantially focused on using phase change memory elements, the embodiments can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating an integrated circuit, the method comprising:
   providing a substrate including isolation regions;
   implanting the substrate to provide a first polarity heavily doped word line and a first polarity lightly doped region contacting the word line between the isolation regions;
   depositing a dielectric material over the substrate;
   etching an opening in the dielectric material to expose a portion of the first polarity lightly doped region;
   implanting the exposed portion of the first polarity lightly doped region to provide a second polarity lightly doped region contacting the word line;
   providing a second polarity highly doped region contacting the second polarity lightly doped region;
   depositing a contact material in the opening; and
   fabricating a memory element coupled to the contact material.

2. The method of claim 1, wherein providing the second polarity highly doped region comprises implanting the exposed portion of the first polarity lightly doped region to provide the second polarity highly doped region contacting the second polarity lightly doped region.

3. The method of claim 1, wherein providing the second polarity highly doped region comprises depositing a second polarity highly doped material into the opening to provide the second polarity highly doped region contacting the second polarity lightly doped region.

4. The method of claim 1, wherein providing the substrate comprises providing a P− silicon substrate including shallow trench isolation regions,
   wherein implanting the substrate comprises implanting the substrate to provide N+ word lines and N− regions,
   wherein implanting the exposed portion of the first polarity lightly doped region comprises implanting the exposed portion of the first polarity lightly doped region to provide a P− region, and
   wherein providing the second polarity highly doped region comprises providing a P+ region.

5. The method of claim 1, wherein fabricating the memory element comprises fabricating a resistivity changing memory element.

6. A method for fabricating an integrated circuit, the method comprising:
   providing a substrate including isolation regions;
   forming a first conductive line in the substrate between isolation regions, the first conductive line comprising a single doping concentration and having a first polarity;
   forming a vertical diode in the substrate, the vertical diode comprising a lightly doped region having a second polarity;
   forming a highly doped region having the second polarity, the highly doped region directly contacting the lightly doped region of the vertical diode;
   forming a silicide layer coupled to the highly doped region, the silicide layer aligned with the vertical diode in a direction perpendicular to the substrate;
   forming a contact coupled to the silicide layer; and
   forming a memory element coupled to the contact,
   wherein the first conductive line provides a portion of the vertical diode.

7. The method of claim 6, wherein forming the first conductive line comprises forming an N+ word line,
wherein the lightly doped region comprises a P− region, and
wherein the highly doped region comprises a P+ region.

8. The method of claim 6, wherein forming the first conductive line comprises forming an N well.

9. The method of claim 6, wherein the vertical diode is self-aligned to the contact.

10. The method of claim 6, wherein forming the memory element comprises forming a resistivity changing material element.

11. The method of claim 6, further comprising:
forming doped semiconductor regions separating the vertical diode from adjacent vertical diodes along the word line.

12. The method of claim 6, further comprising:
forming dielectric material isolation regions separating the vertical diode from adjacent vertical diodes along the word line.

13. The method of claim 6, further comprising:
forming doped semiconductor wells to electrically isolate the vertical diode from adjacent vertical diodes.

14. A method for fabricating a memory, the method comprising:
providing a substrate including isolation regions;
forming an ion implanted word line in the substrate between isolation regions, the word line comprising a single doping concentration and having a first polarity;
forming an ion implanted vertical diode in the substrate, the vertical diode not a part of a transistor, and the vertical diode comprising a lightly doped region having a second polarity;
forming a highly doped region having the second polarity, the highly doped region directly contacting the lightly doped region of the vertical diode;
forming a silicide layer coupled to the highly doped region, the silicide layer aligned with the vertical diode in a direction perpendicular to the substrate;
forming a contact coupled to the silicide layer; and
forming a phase change memory element coupled to the contact,
wherein the word line provides a portion of the vertical diode.

15. The memory of claim 14, wherein forming the word line comprises forming an N+ word line,
wherein the lightly doped region comprises a P− region, and
wherein the highly doped region comprises a P+ region.

16. The memory of claim 14, wherein forming the word line comprises forming an N well.

17. The memory of claim 16, further comprising:
forming P wells,
wherein the word line is isolated from adjacent word lines via the isolation regions and the P wells.

18. The method of claim 14, further comprising:
forming doped semiconductor regions separating the vertical diode from adjacent vertical diodes along the word line.

19. The method of claim 14, further comprising:
forming dielectric material isolation regions separating the vertical diode from adjacent vertical diodes along the word line.

20. The method of claim 14, further comprising:
providing a write circuit configured to write data to the memory element;
providing a sense circuit configured to read data from the memory element; and
providing a controller configured to control the write circuit and the sense circuit.

* * * * *